United States Patent [19]
Ikeda

[11] Patent Number: 5,966,395
[45] Date of Patent: Oct. 12, 1999

[54] SEMICONDUCTOR LASER DRIVE DEVICE AND IMAGE RECORDING DEVICE

[75] Inventor: Chikaho Ikeda, Nakai-machi, Japan

[73] Assignee: Fuji Xerox Co., Ltd., Tokyo, Japan

[21] Appl. No.: 08/978,278

[22] Filed: Nov. 25, 1997

[30] Foreign Application Priority Data

Nov. 29, 1996 [JP] Japan ................................ 8-320410

[51] Int. Cl.$^6$ ............................................ H01S 3/00
[52] U.S. Cl. ...................................... 372/38; 372/31
[58] Field of Search ................................ 372/24, 31, 38

[56] References Cited

U.S. PATENT DOCUMENTS 5,097,473  3/1992  Taguchi ............................... 372/38

FOREIGN PATENT DOCUMENTS

| 59-105568 | 6/1984 | Japan . |
| 60-18982 | 1/1985 | Japan . |
| 63-184773 | 7/1988 | Japan . |
| 4-122656 | 4/1992 | Japan . |
| 4-320384 | 11/1992 | Japan . |
| 6-334248 | 12/1994 | Japan . |

OTHER PUBLICATIONS

H.C. Casey, Jr., et al., "Hetrostructures lasers", Academic Press New York, 1978, pp. 176–179, pp. 224–229 and pp. 258–265. No Month.

Primary Examiner—Rodney Bovernick
Assistant Examiner—Robert E. Wise
Attorney, Agent, or Firm—Oliff & Berridge, PLC

[57] ABSTRACT

The present invention relates to a semiconductor laser drive device, and an image recording device whose function includes scanning a predetermined body to be scanned with a laser beam carrying image information in the course of recording an image, and which makes high speed image regeneration while maintaining a high quality of the image, wherein the devices are equipped with a first feedback circuit including a first operational amplifier and a second feedback circuit including a second operational amplifier, so that the double feedback can concurrently be effected to obtain current vs. light output characteristics with a high speed and high accuracy in an analog mode.

6 Claims, 6 Drawing Sheets

SEMICONDUCTOR LASER DRIVE DEVICE AND IMAGE RECORDING DEVICE

BACKGROUND OF THE INVENTION

1. Field of the Invention

The present invention relates to a semiconductor laser drive device, and an image recording device whose function includes scanning a predetermined body to be scanned with a laser beam carrying image information in the course of recording an image.

2. Related Prior Art

In an image recording device employing, for example, a xerography process, a semiconductor laser suitable for a high speed modulation has been used as means for generating an optical beam.

In the case where such a semiconductor laser is employed for an image recording device, there is provided an intermittent feedback control comprising actions of obtaining a control voltage at which a desired light quantity is attained by conducting APC (Auto Power Control) wherein feedback is effected with use of a photosensor monitoring a light quantity in timing not to give influence on formation of an actual image, in order to emit an optical beam with a desired light quantity from the semiconductor laser; then stopping the feedback while the control voltage is held in either an analog mode or a digital mode; conducting an open loop control, wherein a current supplied to the semiconductor laser is set according to the control voltage being held, in timing to give an influence on formation of an actual image; and thereafter the feedback is applied. In modulation of a semiconductor laser, there are a pulse width modulation mode and an intensity modulation mode and techniques are provided for the respective modes in order to improve a quality of an image. What is especially problematic in application of the intensity modulation mode is how to produce an optical beam giving a desired light quantity in a open loop.

Current vs. output power characteristics of a semiconductor laser will be described below and techniques having been conventionally employed will be explained.

Figure 7:
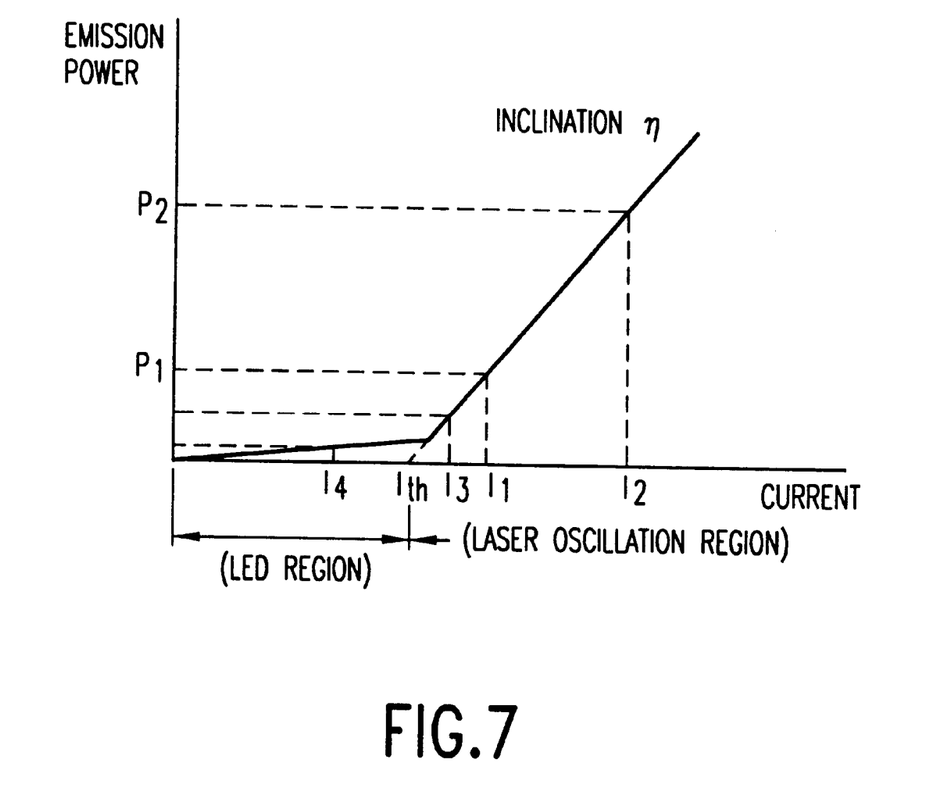
FIG. 7 is a graph showing a relation between the current supplied to a semiconductor laser and the emission power of a laser beam output from the semiconductor laser.

FIG. 7 is a graph showing a relation between the current supplied to a semiconductor laser and the emission power of a laser beam output from the semiconductor laser.

As shown in the figure, the optical output characteristics of an semiconductor laser are divided into two regions, one of which is a LED region where a current supplied to the semiconductor laser is less than a predetermined laser oscillation threshold current $I_{th}$ and the other is a laser oscillation region where a current supplied to the semiconductor laser is the laser oscillation threshold current or more. In the LED region, a laser beam is not emitted from a semiconductor laser and in the laser region, an optical output having a power roughly proportional to a magnitude of a remaining current obtained after a supplied current is subtracted with the laser oscillation threshold current $I_{th}$. For this reason, it is necessary to exactly determine the laser oscillation threshold current $T_{th}$ and an inclination η (laser emission efficiency) in the laser oscillation region. The reason is that it is necessary for a bias current having a magnitude in the vicinity of the laser oscillation threshold current $I_{th}$ to be made to constantly flow including a time when no laser beam is emitted, in order to secure a high speed exchange between an ON state and off state (see [Hetrostructures lasers] HC CASEY, JR., M. B. PANISH, ACADEMIC PRESS NEW YORK 1978, Japanese Published Unexamined Patent Application No. Sho 60-18982) and there is another requirement to exactly determine a drive current to overlap the bias current in order to obtain a correct quantity of emission. Since these threshold current and inclination are fluctuated in each semiconductor laser and affected by environmental conditions, too, they are not allowed to be kept at respective values obtained in advance, and it is necessary to frequently refresh the values to new, most suitable ones even during operation.

In Japanese Published Unexamined Patent Application No. Sho 63-184773, disclosed is a semiconductor laser drive device, which is equipped with a plurality of weighted current sources and a bias current source and, which is controlled by a microprocessor. In the publication, proposed is a system wherein, in determining the above-mentioned threshold current $I_{th}$ and inclination η, a bias current is first determined by detecting a slight emission from the laser when only the bias current is in an ON state, then a reference voltage for driving the plurality of current sources is set when a predetermined maximum quantity of emission is reached with increase in a drive current till a predetermined maximum quantity of emission under a condition of all the current sources being in ON states, and thereafter an intensity modulation between the light emission quantity by the bias current only and the maximum quantity of emission is effected by controlling a current source switch. When the system is applied to a semiconductor drive device in laser xerography, if the minimum light output is set to be too large like a current $I_3$ shown in FIG. 7, a latent image is produced even with non-existence of data and on the other hand if it is set to be too small like a current $I_4$ shown in FIG. 7 and a current is in the LED region, since a differential quantum efficiency is very low, a slight difference in level causes a large change in magnitude of the drive current, so that, in the case where a drive current is set at greatly small value, a current does not reach the laser oscillation region even if data is input and thereby almost no latent image is formed.

In Japanese Published Unexamined Patent Application No. Hei 4-122656, disclosed is a technique, in which beams with a plurality of predetermined light quantity levels $P_1$, $P_2$ are emitted in a region where a relation between the control current of a semiconductor laser and the optical output of the laser is linear, a plurality of control voltages to output a plurality of currents corresponding to the plurality of predetermined light quantities are stored and a relation between the current and emission power is obtained by a digital computing using a CPU. In Japanese Published Unexamined Patent Application No. Hei 4-320384, proposed is a technique in which a predetermined emission power is obtained by increasing the number of set levels of light quantities, even when a relation between the current supplied to a semiconductor laser and the emission power of the semiconductor laser is not linear. Though theses two examples are excellent in regard to accuracy of intensity modulation, a CPU is required because each conducts control in a digital mode. A data width required for obtaining 256 tones demands a data size of at least 8 bits, actually 12 bits due to non-linearity of characteristics of a photoreceptor, which is a cause of cost increase. In addition, a program of a great length has to be executed to process all data in a digital mode. For such reasons, APC consumes an excessively great length of time and as a result, if laser xerography is applied, a time to modulate a laser with a image data is restricted.

As a system implementing the same in an analog mode, Japanese Published Unexamined Patent Application No. Hei 6-334248 is named. In this publication, a system in which in order to conduct APC (Auto Power Control), the minimum value is first set in a sample hold circuit and then the maximum value is set in another sample circuit by controlling a gain of a D/A converter placed in a feedback loop for setting the maximum value. According to this system, since the setting of a control voltage is all effected in an analog mode, setting of the minimum or maximum value is effected when a signal is converged in a feedback loop, so that the setting is completed in a very short time. In this system, there is no need for a CPU, since no digital computing is performed. There is, however, a problem similar to the one in the technique disclosed in the publication of Unexamined Japanese Patent Application Sho 63-184773, that the minimum light quantity is set too large or too small.

There is a need for employing a region where the light quantity vs. the current is in a linear relation in order to effect intensity modulation with high accuracy. For that purpose, a laser oscillation threshold current $I_{th}$ which is an intersection point of an extrapolation of the straight line with the x axis (the axis of the current), where the light quantity is zero, should be determined (see [Heterostructures Lasers] HC CASEY, JR., M. B. PANISH, ACADEMIC PRESS NEW YORK 1978). However, since this $I_{th}$ has conventionally been able to be obtained only in a digital computing, a digital computing has had to be effected at the sacrifice of a speed APC and cost. If an analog computing had been adopted, a way would have been allowed, in which $I_{th}$ was computed in a simple manner with a very small quantity of light at the sacrifice of control accuracy without extrapolation, so that APC was conducted at a high speed and in a simple manner (see Japanese Published Unexamined Patent Application No. Sho 59-105568).

SUMMARY OF THE INVENTION

The present invention has, in light of the above circumstances, objects to provide a semiconductor laser drive device in which characteristics of current vs. optical output are obtained in an analog mode at a high speed and with high accuracy, and to provide an image recording device enabling a high speed image display which maintains a high quality by including the semiconductor laser drive device.

A semiconductor laser drive device achieving an above object comprising:

a drive current source supplying a drive current, which is the drive current having a magnitude corresponding to a first set value, and whose gain is adjusted according to a gain control value, to a semiconductor laser;

a bias current source supplying a bias current corresponding to a current control value to the semiconductor laser;

a monitor value generating circuit generating a monitor value which is obtained by adding a first monitor value, which is the first monitor corresponding to a second set value, and whose gain is adjusted according to the gain control value, to a second monitor value corresponding to the current control value;

a first feedback circuit supplying a current to the bias current source and the monitor value generating circuit, wherein a light emission quantity monitor signal, which is obtained by monitoring a light emission quantity of the semiconductor, and a predetermined first reference value are input and the current control value is generated so as to emit a light emission quantity corresponding to the first reference value from the semiconductor laser; and a second feedback circuit supplying a current to the drive current source and the monitor generating circuit, wherein a monitor value which is generated in the monitor generating circuit and a predetermined second reference value are input and the gain control value is generated so as to generate the monitor value corresponding to the second reference value.

Here, a semiconductor laser drive device according to the present invention is preferably, in a more concrete manner, comprising:

a first mode supplying a current to the drive current source and the monitor generating circuit, wherein the same set value as the second set value input to the drive current source is input to the drive current source as the first set value at the same time a reference value corresponding to the second set value to the first feedback circuit is input to the first feedback circuit as the first reference value, and the gain control value is generated in the first feedback circuit in stead of the second feedback circuit;

a second mode supplying a current to the bias current source and the monitor generating circuit, wherein a set value different from the second set value input to the monitor circuit generating circuit is input to the drive current source as the first set value at the same time a reference value corresponding to the first set value is input to first feedback circuit as the first reference value, and the current control value is generated in the first feedback circuit; and a monitor value holding circuit holding a monitor value generated by the monitor generating circuit in the first mode, wherein the monitor value in the first mode being held in the monitor value holding circuit is input to the second feedback circuit in the second mode to generate the gain control value, and it is supplied to the drive source and monitor value generating circuit.

In the above semiconductor laser drive device of the present invention, the monitor generating circuit preferably is a circuit in which, when a monitor value is indicated at M, a current value of the drive current is indicated at $I_D$, a current value of the bias current is indicated at $I_B$ and a proportional constant is indicated at C, a monitor value M is generated in accordance to an equation:

$$M = C \times \{(\text{a second set value/a first set value}) \times I_D + I_B\}$$

In this case, when a light emission quantity of the semiconductor laser supplied with a current $(I_D+I_B)$ is indicated at $P_1$ and a light emission quantity of the semiconductor laser supplied with a current $\{(\text{a second set value/a first set value}) \times I_D + I_B\}$ is indicated at $P_2$, the first and second reference values may be determined, in the first and second feedback circuits, so as to generate a gain control value and current control value which satisfy an equation:

$$P_2/P_1 = \text{a second set value/a first set value}$$

The monitor generating circuit may comprises:

a drive current mirror circuit generating a first monitor current whose magnitude is $\{C \times (\text{a second set value/a first set value}) \times I_D\}$; and a bias current mirror circuit generating a second monitor current whose magnitude is $(C \times I_B)$.

An image recording device according to the present invention achieving an above-mentioned object is an image recording device whose function includes scanning a predetermined body to be scanned with a laser beam carrying image information in the course of recording an image, comprising:

a semiconductor laser emitting a laser beam;

a photosensor generating a light emission quantity monitor signal by monitoring a light emission quantity of the semiconductor laser;

a semiconductor laser drive unit supplying a current to the semiconductor laser;

a scanning optical system scanning a predetermined body to be scanned by a laser beam emitted from the semiconductor laser, and the semiconductor laser drive unit comprising:

a drive current source supplying a drive current, which is the drive current having a magnitude corresponding to a first set value, and whose gain is adjusted according to a gain control value to a semiconductor laser;

a bias current source supplying a bias current corresponding to a current control value to the semiconductor laser;

a monitor value generating circuit generating a monitor value which is obtained by adding a first monitor value, which is the first monitor corresponding to a second set value, and whose gain is adjusted according to the gain control value, to a second monitor value corresponding to the current control value;

a first feedback circuit supplying a current to the bias current source and monitor value generating circuit, wherein a light emission quantity monitor signal, which is obtained by monitoring a light emission quantity of the semiconductor, and a predetermined first reference value are input and the current control value is generated so as to emit a light emission quantity corresponding to the first reference value from the semiconductor laser; and a second feedback circuit supplying a current to the drive current source and monitor generating circuit, wherein a monitor value which is generated in the monitor generating circuit and a predetermined second reference vale are input and the gain control value is generated so as to generate the monitor value corresponding to the second reference value.

DETAILED DESCRIPTION OF THE INVENTION

Embodiments of the present invention will be described below.

Figure 1:
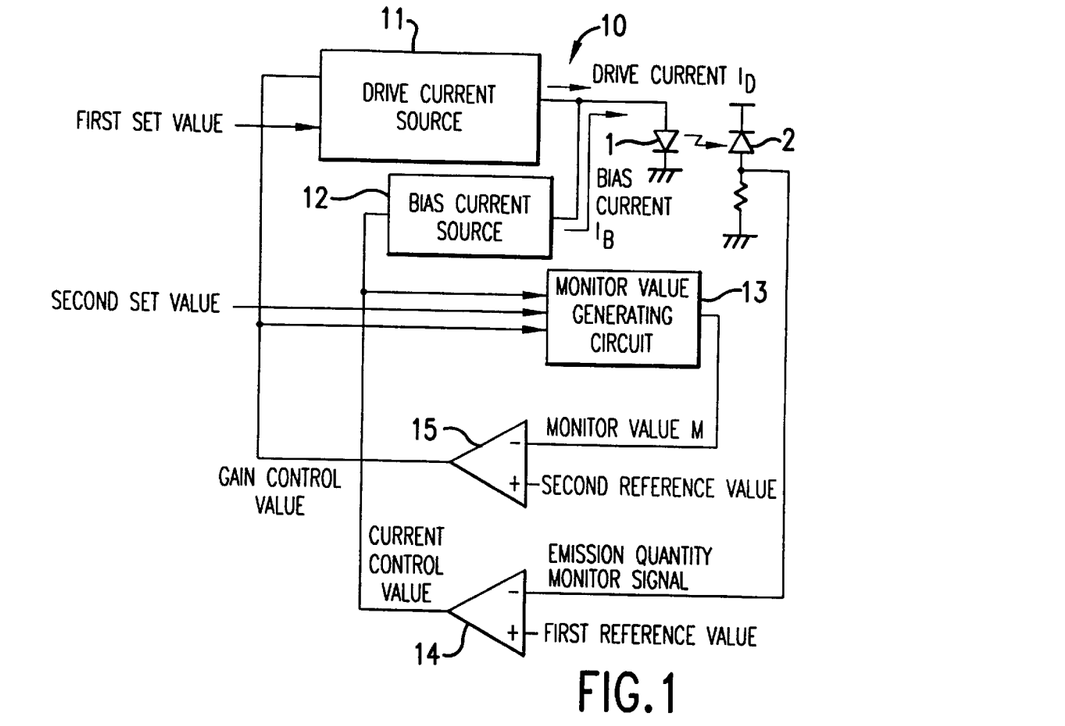
FIG. 1 is a block diagram showing a fundamental embodiment of a semiconductor laser drive device of the present invention.
Figure 2:
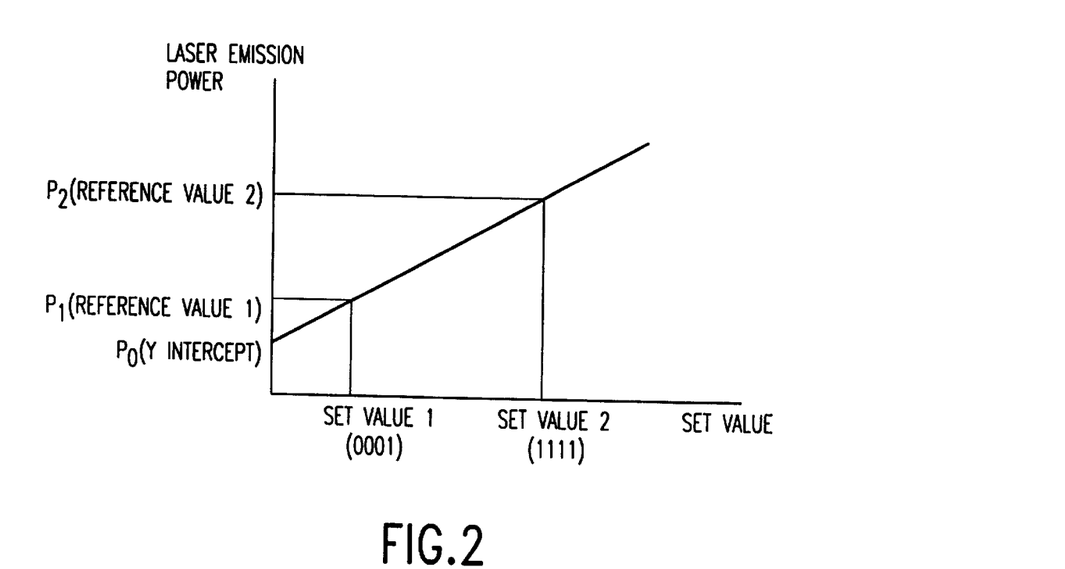
FIG. 2 is a graph showing a relation of correspondence between the set value and the laser emission power for explanation of the semiconductor laser drive device shown in FIG. 1.
Figure 3:
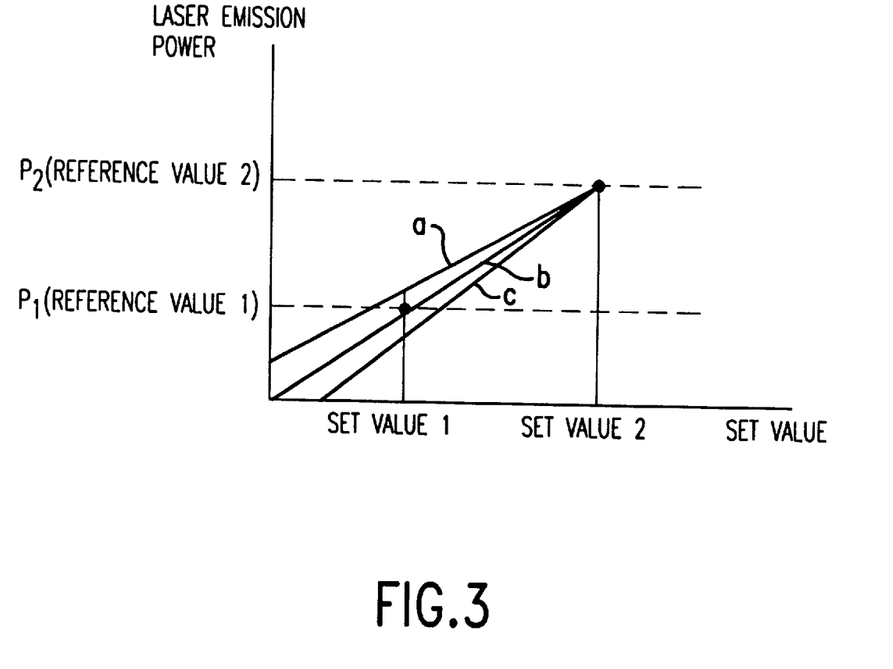
FIG. 3 is a graph showing another relation of correspondence between the set value and the laser emission power for explanation of the semiconductor laser drive device shown in FIG. 1.

FIG. 1 is a block diagram showing a fundamental embodiment of a semiconductor laser drive device of the present invention and FIGS. 2 and 3 each are a graph showing a relation of correspondence between the set value and the laser emission power for explanation of the semiconductor laser drive device shown in FIG. 1.

A semiconductor laser drive device 10 shown in FIG. 1 comprises a drive current source 11, a bias current source 12, a monitor value generating circuit 13, a first operational amplifier 14, and second operational amplifier 15.

A first set value is input to the drive current source 11 and the drive current source 11 supplies the semiconductor laser 1 with a drive current $I_D$ corresponding to the input first set value. A gain control value, which is an output of a second operational amplifier 15, is input to the drive current source 11 and a gain of the drive current source 11 is adjusted in accordance with the input gain control value. Therefore, the drive current $I_D$ output from the drive current source 11 is a current which is adjusted in accordance with the gain control value even in a condition that the first set value is a fixed value.

A current adjustment value, which is an output from the first operational amplifier 14, is input to the bias current source 12 and a bias current $I_B$ corresponding to the current control value is supplied to the semiconductor laser 1. The bias and drive currents $I_B$, $I_D$ are therefore supplied in an overlapped manner. A sum total of the two currents $I_B$, $I_D$ is hereinafter called a supply current.

The monitor value generating circuit 13 is a circuit which has a function as if the circuit had, for example, the drive current source 11 and bias current source 12. That is, a second set value, the gain control value generated in the second amplifier 15, and the current control value generated in the first amplifier 14 are input to the monitor value generating 13, and a monitor value is generated by adding a first monitor value corresponding to the second set value, which is obtained by adjusting a gain according to the gain control value (that is, the first monitor value corresponding to the drive current $I_D$ generated in the drive current source 11) to a second monitor value corresponding to the current control value (that is, the second monitor value corresponding to the bias current $I_B$ generated in the bias current source 12). The first set value is input to the drive current source 11, and the second set value is input to the monitor value generating circuit 13. The first monitor value therefore does not directly corresponds to the drive current $I_D$ which is generated in the drive current source 11 but directly corresponds to the bias current $I_B$ when the first and second set values are equal to each other.

In the embodiment, in a more concrete manner, when a drive current generated in the drive current source 11 is indicated at $I_D$, a bias current generated in the bias current source 12 is indicated at $I_B$, and a proportional constant is indicated at C, in the monitor value generating circuit 13, a monitor value M is generated according to an equation:

$$M = C \times \{(\text{a second set value/a first set value}) \times I_D + I_B\} \quad (1)$$

A laser beam emitted from the semiconductor laser by supplying a supply current $I_B + I_D$ to the semiconductor laser 1 is received by a photodiode 2 and the photodiode 2 generates a light emission quantity monitor signal, which is then input to the first operational amplifier 14.

A predetermined first reference value is also input to the first operational amplifier 14 and a current control value is generated in such a manner that the semiconductor laser 1 emits a light emission quantity corresponding to the first reference value and the current control value is input to the bias current source 12 and monitor value generating circuit 13. The bias current source 12, as described above, generates the bias current $I_B$ having a magnitude corresponding to the current control value and supplies it to the semiconductor laser 1. On the other hand, the monitor value generating circuit 13 generates a second monitor value $C \cdot I_B$ (see the equation (1)) and the second monitor value is added to the first monitor value in the circuit.

A loop routing through the first operational amplifier 14, the bias current source 12, the semiconductor laser 1 and the photodiode 2 is the first feedback circuit of the present invention.

A monitor value M generated in the monitor generating circuit 13 is input to the second operational amplifier 15, a gain control value is generated by being compared with the predetermined second reference value, and the gain control value is input to the current drive current source 11 and monitor value generating circuit 13. In the drive current source 11, a gain of the drive current source 11 is adjusted, under the condition that the current $I_B+I_D$ supplied to the semiconductor laser is maintained at a constant current corresponding to the first reference value, by a margin, by which the bias current $I_B$ is adjusted by the current control value and, in accompany with that, the drive current $I_D$ is adjusted. In the embodiment, a loop routing through the second operational amplifier 15, the drive current source 11, the semiconductor laser 1, and the photodiode 2 is the second feedback circuit of the present invention.

Here, if set values 1 and 2 are respectively given as the first and second set values, as shown in FIG. 2 and a reference value 1 corresponding to a light emission power $P_1$ and a reference value 2 corresponding to a light emission power $P_2$ are respectively given as the first and second reference values, a straight line is determined and a bias current corresponding to a light emission power $P_0$ which is a y-intercept at a set value=0 is determined. That is to say, it means that in the example shown in FIG. 2, when the drive current $I_D=0$ (which corresponds to a set value=0) and only the bias current $I_B$ is supplied to the semiconductor laser as a supply current, the semiconductor laser emits the emission power $P_0$.

Then the bias current $I_B$ is equal to the laser oscillation threshold current $I_{th}$ and the drive current $I_D$ can make a light emission power exactly proportional to a set value by determining respective set values and respective reference values so as to satisfy the equation $P_2/P_1$=a second set value/a first set value and in addition so that a straight line b passing an origin of a coordinate system is determined. And when a slight emission in the LED region (see FIG. 7) is problematic, the bias current $I_B$ smaller than the laser emission threshold $I_{th}$ may be set by making a reference value lower so that a straight line c is selected. When a high speed is required, the bias current $I_B$ may be set at a value lager than the laser emission threshold $I_{th}$ by a slight margin by making a reference value higher so that a straight line a is selected, so that the bias current $I_B$ keep a laser in oscillation even at a set value=0 and it makes high speed modulation possible.

As mentioned above, according to the above-mentioned embodiment, laser output characteristics can be correctly set to set values it necessary.

Moreover, when a linearity of current vs. optical output is poor with the set value 1 in emission in the LED region, the linearity can be improved by setting the set value 1 nearer the set value 2.

According to the above-mentioned embodiment, the embodiment comprises the first feedback circuit having the operational amplifier 14 and the second feedback circuit having the second operational amplifier 15 while the first and second feedback circuits are made to function at the same time, and as a result, the straight lines as shown in FIGS. 1 and 2 in the first feedback circuit having the operational amplifier 14 (the characteristics of laser emission power to set values) are determined in an analog mode, so that required time is shortened by a great margin, compared with the case where the threshold current is determined by a digital computing, which has herein been described as a conventional technique. When the semiconductor laser drive device is applied to an image recording device, an image with high quality is obtainable since a light quantity is correctly adjustable and a high speed image display can be achieved due to its ability of a high speed APC performance.

Figure 4:
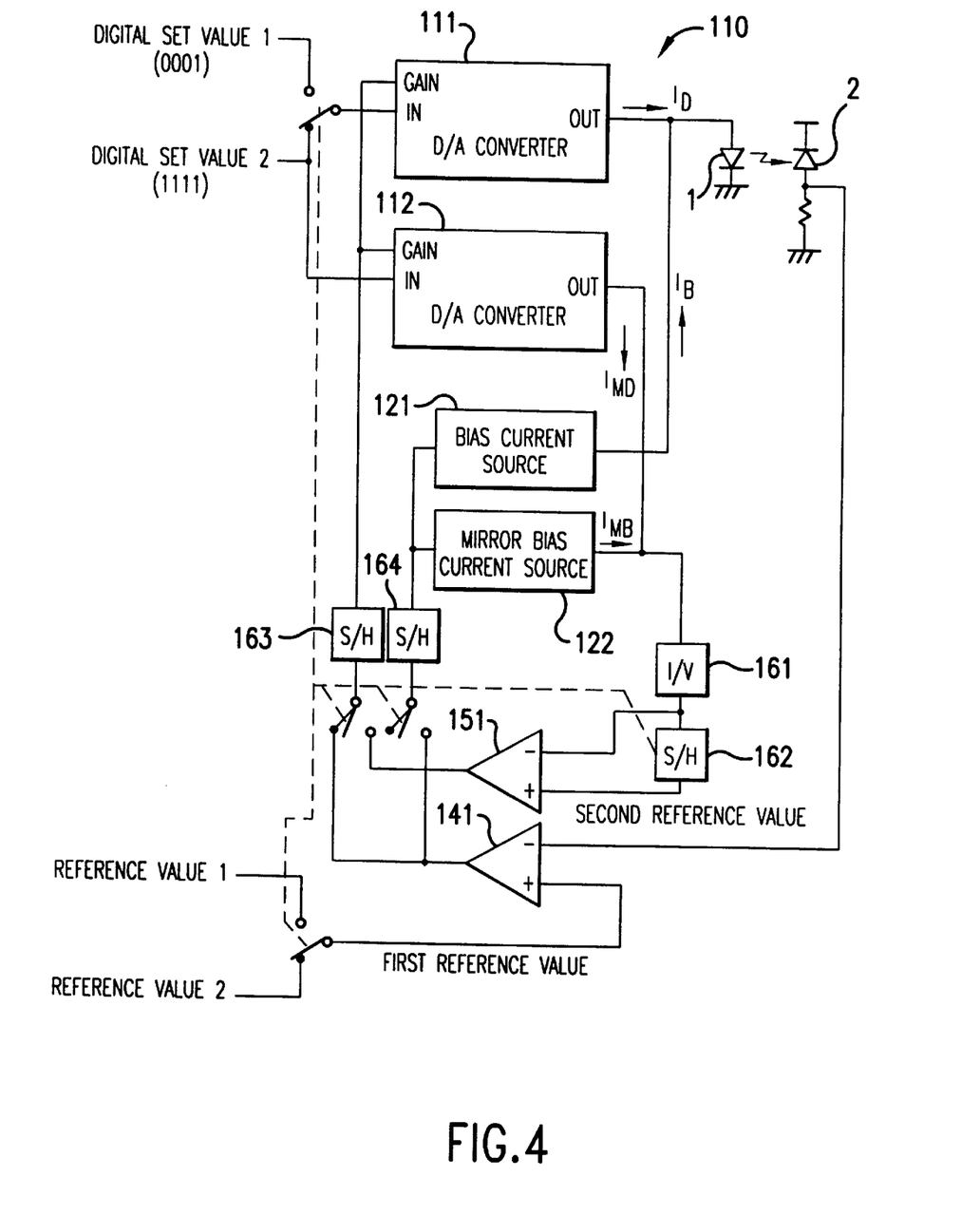
FIG. 4 is a block diagram showing a more concrete embodiment of a semiconductor laser drive device of the present invention.

FIG. 4 is a block diagram showing a more concrete embodiment of a semiconductor laser drive device of the present invention.

A semiconductor laser drive device 110 shown in FIG. 4 comprises a first D/A converter 111, a second D/A converter 112, a bias current source 121, a mirror bias current source 122, a first operational amplifier 141, a second operational amplifier 151, an I/V converter 161, a first sample holder 162, a second and third sample holders 163, 164 and a plurality of switches shown in the figures. These switches are in unison switched in an interlocking manner and hereinafter a state where an arm is connected with a terminal of a solid circle is called a first mode, and a state where an arm is connected with a terminal of a circle is called a second mode.

The first D/A converter 111 corresponds to a drive current source of the present invention, a digital set value is input through a digital signal input terminal IN, an analog current having a current value corresponding to the input set value is output from an analog output terminal OUT, and the analog current is supplied to a semiconductor laser 1 as a drive current $I_D$. The first D/A converter 111 is equipped with a control terminal GAIN, a gain control signal (the gain control value of the present invention) is input from the gain terminal GAIN and the first D/A converter 111 is constructed in such a manner that a gain of the output analog current value corresponding to the input digital set value may be adjusted in accordance with the input gain control signal therein. In APC, the digital set value 2 is input to the first D/A converter 111 in the first mode (see FIG. 2) and a digital set value 2 is input when the mode is changed to the second mode.

The second D/A converter 112 constitutes a part of the monitor generating circuit of the present invention and the converter comprises a digital input terminal IN, a control terminal GAIN, and an analog output terminal OUT in the same manner as the first D/A converter 111. In the embodiment, the second D/A converter 112 is constructed in such a manner that a drive current for monitoring $I_{MD}$ (which corresponds to the first monitor value of the present invention) has a current value of one-tenths of the same digital set value and the same gain set value, compared with the first D/A converter 111. This is to set a level at which power consumption of the semiconductor laser drive device 110 is suppressed and at the same time the monitor current $I_{MD}$ can accurately be monitored. For example, the drive current $I_D$ is commonly 10 mA or more and if the first monitor current $I_{MD}$ is given at a value of one-tenths of 1 mA or more, a noise margin can sufficiently be secured. A digital set value 2 is fixedly input to the second D/A converter 112, regardless of whether the converter is in the first mode or second mode in APC.

The bias current source 121 corresponds to the bias current source of the present invention, a current control signal is input to the bias current source 121, a bias current IB having a current value corresponding to the input current control signal is generated in the bias current source 121, and the bias current $I_B$ is supplied to the semiconductor laser 1 together with the drive current $I_D$ output from the first D/A converter 111.

The current control signal same as the current control signal input to the bias current source 121 is input to a mirror current source 122 and the mirror bias current source 122 outputs a bias current for monitoring $I_{MB}$ (which corresponds to the second monitor value of the present invention) of one-tenths of the bias current $I_B$ output from the bias current source 121. The mirror bias current source 122 constitutes part of the monitor value generating circuit of the present invention together with the second D/A converter 112.

An I/V converter 161 outputs a voltage signal (hereinafter referred to as monitor voltage) which corresponds to a sum total of a current (hereinafter referred to monitor current) flowing into the I/V converter 161, that is to say, the bias current $I_{MD}$ output from the second D/A converter 112 and the bias current for monitoring $I_{MB}$ output from the mirror bias current source 122. The monitor voltage is input to the sample holder 162 and a monitor voltage at a time when the first mode, later described, is switched to the second mode is held in the sample holder 162.

A light emission quantity monitor signal obtained by receiving part of emission from the semiconductor laser 1 by the photodiode 2 and a reference value corresponding to a mode (a reference value ② in the first mode or a reference value ① in the second mode) is input to the operational amplifier 141. Here, the reference values ① and ② are different in magnitude from each other and either reference value corresponds to the first reference value, which is input to the first feedback circuit, of the present invention. An output signal of the first operational amplifier 141 is, in the first mode, input to the first D/A converter 111 and second D/A converter 112 as a gain control signal by way of the sample holder 163 and, in the second mode, input to the bias current source 121 and mirror current source 122 as a current control signal by way of the sample holder 164. The first operational amplifier 141 constitutes part of the first feedback circuit.

A monitor voltage which has passed through the sample holder 162 and a monitor voltage before it is input to the sample holder 162 are input to the second operational amplifier 151. The second operational amplifier 151 is effective in the second mode, a monitor voltage in the instant when the first mode is switched to the second mode is held in the first sample holder 162 and the held monitor voltage (which corresponds to a second reference value of the present invention) and a present monitor voltage in the second mode are input to the second operational amplifier 151. An output signal of the second operational amplifier 151 is input as a gain control signal to the first D/A converter 111 and second D/A converter 112 by way of the second sample holder 163 in the second mode.

The second and third sample holders 163, 164 are used for switching in APC, that is, between a feedback control and an open loop control. In the APC, which is at issue here, the situation is in a through condition where the input passes through the system as an output without any change therein and, when an APC operation, later described, is completed, a gain control signal which is an output signal of the second operational amplifier 151 and a current control signal which is an output signal of the first operational amplifier 141 are held till the starting of the next APC operation.

An APC operation of a laser drive device shown in FIG. 4 will be described below.

The switches for switching are set in the state shown in the figure (the first mode) and the first sample holder 162 and the second and third sample holders 163, 164 are all set in the through state.

In this situation, a digital set value 2 (see FIG. 2), for example (1111) in a binary notation, is input to the first and second D/A converters 111, 112 and a drive current $I_D$ and monitor drive current $I_{MD}$ which correspond to the digital set value 2 are output. In this first mode, a bias current $I_B$ output from the bias current source 121 and a monitor bias current $I_{MB}$ output from the mirror bias current source 122 are set at respective predetermined initial values.

A drive current $I_D$ output from the first D/A converter 111 and a bias current $I_B$ output from the bias current source 121 are supplied to the semiconductor laser both in one combined current and the semiconductor laser 1 emits a light emission quantity corresponding to the combined supply current $(I_D+I_B)$. The emission is monitored by the photodiode 2 and a light emission quantity monitor signal is input to the first operational amplifier 141. In this first mode, the second reference value ② is input to the first operational amplifier 141, an output signal of the first operational amplifier 141 is input to the first and second D/A converters 111, 112 as a gain control signal, passing through the second sample holder 163 in a through condition without any change therein, a gain of the first D/A converter 111 is adjusted in such a manner that the semiconductor laser 1 may emit a light emission power $P_2$ (see FIG. 2) corresponding to the reference value 2 and, in accompany with this, a gain of the second D/A converter 112 is adjusted, too.

On the other hand, the monitor drive current $I_{MD}$ having a magnitude of one-tenths of the drive current $I_D$ output from the second D/A converter 112 and the monitor bias current $I_{MB}$ having a magnitude of one-tenths of the bias current $I_B$ output from the mirror bias current source 122 are in combination input to the I/V converter 161 and a monitor voltage corresponding to the combined monitor current is generated which voltage is then applied to the first sample holder 162. When the circuit is stabilized in the above situation, the first mode is switched to the second mode and a monitor voltage is held in the sample holder 162.

That is to say, the semiconductor laser 1 emits a laser emission power $P_2$ which is determined by the reference value ② in the first mode and a monitor voltage, which carries information on a current value of the supply current to the semiconductor laser 1 at the time, is held in the first sample holder 162. The monitor value in the first mode held in the sample holder 162 is, as described above, input to the second operational amplifier 151 as "the second reference value" of the present invention in the second mode. Thus, the set value 2, the emission power $P_2$, and the reference value ② are made to mutually correspond.

The switches shown in FIG. 4 are connected with other terminals each having a circle in the second mode. In the second mode, the first feedback circuit including the first operational amplifier 141 and the second feedback circuit including the second operational amplifier 151 are concurrently in an operational condition. In the second mode where the switches shown in FIG. 4 are connected to the terminal having circles, the digital set value 1 (see FIG. 2), for example (0001) in a binary notation, is input to the first D/A converter 111 and the reference value ① is input to the first operational amplifier 141. The digital set value 2 is continually kept to be input to the second D/A converter 112 even in the second mode.

In the second mode, as described above, an output signal of the first operational amplifier 141 is input to the bias current source 121 and mirror current source 122 as a current control signal, passing through the third sample holder 164 and an output signal of the second operational amplifier 151 is input to the first and second D/A converters 111, 112 as "a gain control signal", passing through the second sample holder 163.

In the second mode, the digital set value 2 is continued to be input to the second D/A converter 112 without any change from when in the first mode, a monitor value in the first mode held in the first sample holder 162 and a present monitor value are input to the second operational amplifier 151. Accordingly, the second operational amplifier 151 outputs a gain control single having a gain at which the semiconductor laser 1 would emit a light emission power $P_2$ corresponding to the reference value ②, if the digital set value 2 was continued to be input to the first D/A converter 111 and controls gains of the first D/A converter 111 and second D/A converter 112.

However, actually, since a digital set value 1 is input to the first D/A converter 111, a gain supplied from the second operational amplifier 151 and a drive current ID corresponding to the set value 1 are output from the first converter 111 and supplied to the semiconductor laser 1 together with the bias current $I_B$. A light emission quantity of the semiconductor laser 1 is monitored by the photodiode 2 and the light emission quantity monitor signal is input to the first operational amplifier 141. On the other hand, the reference value ① corresponding to the digital set value 1 is input in the first operational amplifier 141 in the second mode. Therefore, a feedback is conducted so as to have the current value of a bias current $I_B$ output from the bias current source 121 to be adjusted in such a manner that a light emission power of the semiconductor laser 1 may become a light emission power P1 corresponding to the reference value ① by an output signal of the first operational amplifier 141. Moreover, in accompany with that, the current value of a monitor bias current $I_{MB}$ output from the mirror bias current source 122 is adjusted.

For example, there is assumed a case where an initial value of the bias current $I_B$ in the first mode is $I_B$=0. After being switched to the second mode, a feedback is conducted by the actions that a bias current $I_B$ is increased and at the same time a drive current $I_D$ is decreased due to decrease in again of the first D/A converter 111 in such a manner the two conditions are satisfied at the same time, (i) one of which is for the semiconductor laser 1 to maintain a light emission power $P_2$ corresponding to the reference value ② when the set value 2 is continued to be input to the first D/A converter 111, and (ii) the other is for the semiconductor laser 1 to emit a light emission power $P_1$ corresponding to the reference value ①. When the current value as an initial value of the bias current $I_B$ is a value other than the value $I_B$=0, it is also a case similar to the above-mentioned case and, after being switched to the second mode, a current value of the bias current $I_B$ and a gain of the first D/A converter 111 are adjusted so as to satisfy the conditions. Charge amounts of the sample holders 163, 164 are set so as to have the semiconductor laser 1 to emit power $P_1$ corresponding to the reference value ① in the case of the set value 1 and to emit power $P_2$ corresponding to the reference value ② in the case of the reference value 2, and as a result, straight lines as shown in FIGS. 2 and 3 are determined.

When signals in the whole circuit are stabilized in the second mode, the second and third sample holders 163, 164 each come to be in a hold state, and accordingly APC terminates and an open-loop control starts after the termination of APC. On this occasion, a current value of the bias current source is set at a value when (0000) as a digital set value is input to the first D/A converter 111.

Figure 5:
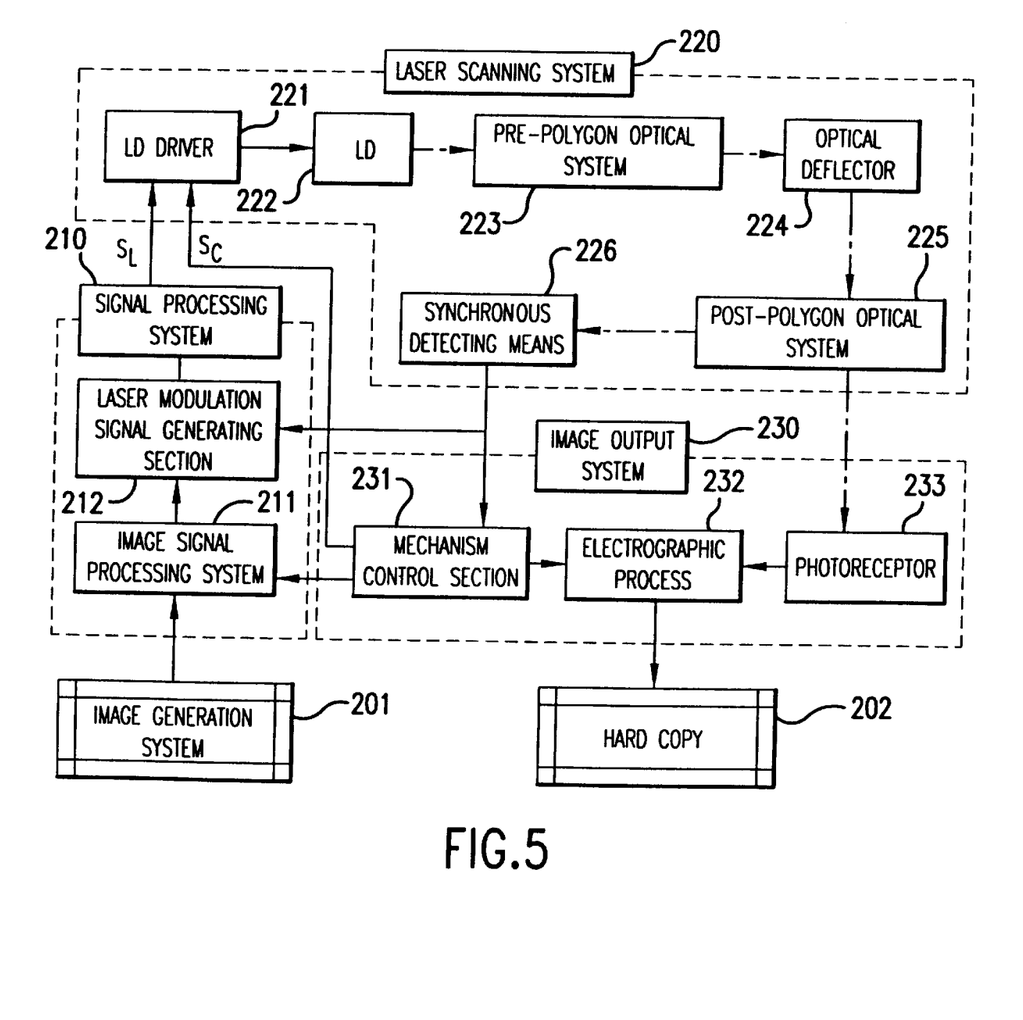
FIG. 5 is a block diagram showing an embodiment of an image recording device of the present invention.
Figure 6:
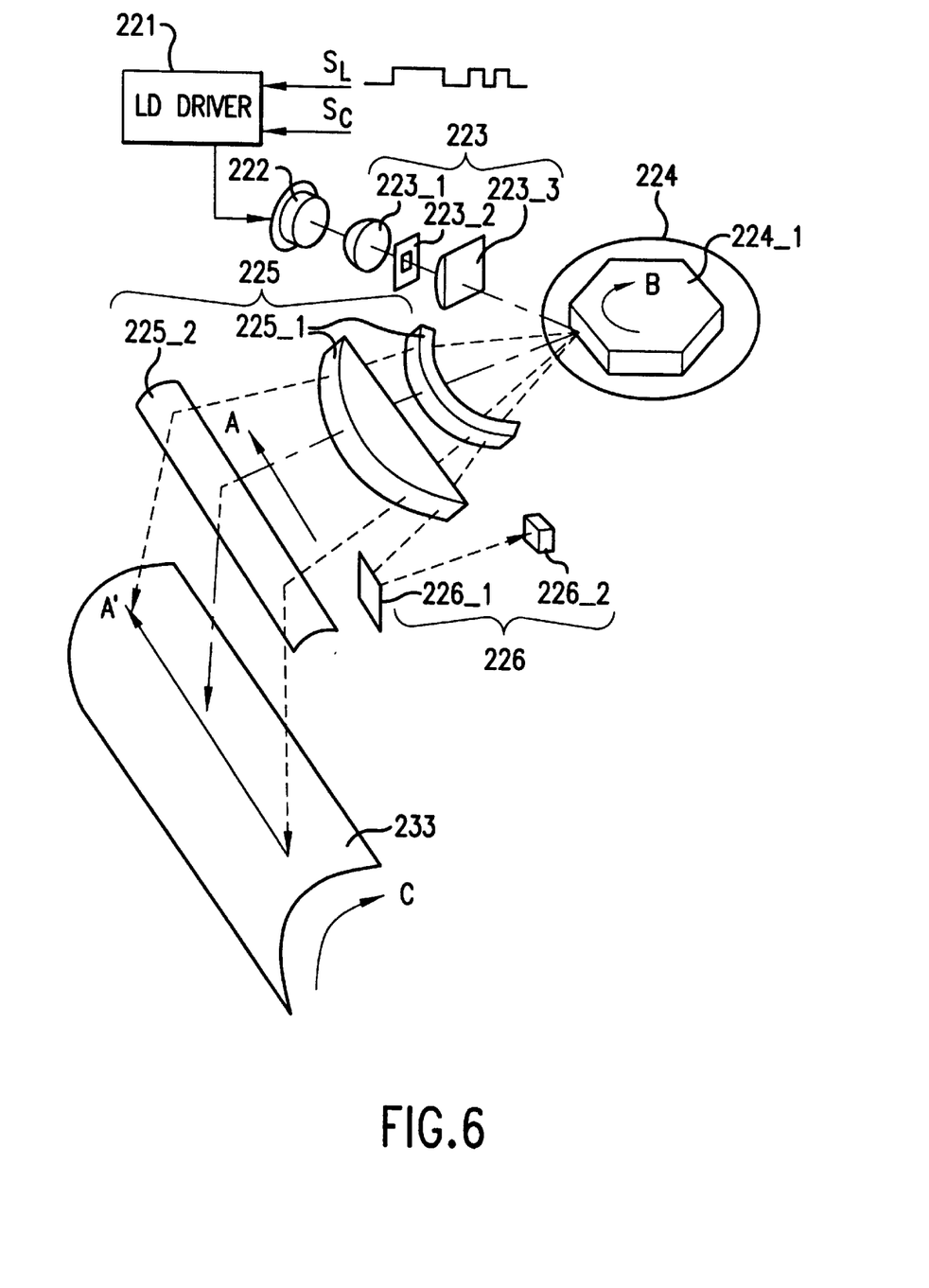
FIG. 6 is a perspective view illustrating a configuration of a laser scanning system of the image recording device shown in FIG. 5.

FIG. 5 is a block diagram showing an embodiment of an image recording device of the present invention. FIG. 6 is a perspective view illustrating a configuration of a laser scanning system of the image recording device shown in FIG. 5.

An image recording device is divided into a signal processing system 210, a laser scanning system 220 and an image output system in construction. When an image signal obtained in an image generation system 201 such as a digital scanner, in which an image is read and an image signal is obtained, is input to the image signal processing system 211 constituting the signal processing system 210, the signal processing system 211 receives control information, for example a developing condition, from a mechanism control section 231 which controls an electrophotographic process 232 constituting the image output system 230, a proper image processing such as a gradation processing, a color correction processing and the like is given to the input image signal so as to conform with the control information, and the image signal after the image processing is input to a laser modulation signal generating section 212. In the laser modulation signal generating section 212, a laser modulation signal is generated which expresses a modulation intensity of a laser beam which is emitted from a laser diode 222 constituting the laser scanning system 220. The laser modulation signal is generated in such a manner that information is received in the laser modulation signal generating section 212 from synchronization detecting means 226 for a scanning laser beam constituting the laser scanning system 220 and thereby the laser modulation signal is made to be synchronized with the laser scanning. The synchronization detecting means 226 for the scanning laser beam comprises a mirror 226_1 and an optical sensor 226_2, and a synchronous pulse is once output from the optical sensor 226_2 each time when a laser bean which is emitted from the laser diode 222 is deflected in the direction A shown in FIG. 6.

A laser modulation signal $S_L$ generated in the laser modulation signal generating section 212 is input to a LD driver 221 constituting the laser scanning system 220. A mechanism control information $S_C$ from the mechanism control section 231 is also input to the LD driver 221 and the LD driver 221 drives a semiconductor laser (LD; laser diode) 222 in accordance with the mechanism control. The semiconductor laser 222 emits a laser beam with intensity modulation in a time series manner by driving with the LD driver 221, The emitted laser beam passes through pre-polygon optical system 223 comprising a lens 223_1, an aperture 223_2, a cylindrical lens 223_3 and is further repeatedly deflected by an optical deflector 224 comprising a polygonal mirror 224_1 rotating in the direction A. The deflected beam passes a post-polygon optical system 225 comprising an f θ lens 225_1 and a cylindrical mirror 225_2 and is repeatedly scanned (main scanning) on a photoreceptor 223 rotating in the direction A', which constitutes the image output system 230.

The photoreceptor 233 has a property that a resistivity in the surface region is changed on optical irradiation and an electrostatic latent image is formed on the surface by scanning with a laser beam carrying image information. The electrostatic latent image formed on the photoreceptor 233 is subjected to processes including a predetermined electrophotographic process 232, so that a hard copy 202 with a printed image thereon is produced, which the image signal carries, said image signal being obtained in the image generation system 201.

The semiconductor laser drive device having the structure described in reference to FIG. 4 is included in the LD driver 221 in the image recording device according to the embodiment. Accordingly, in the image recording device, since the light emission quantity of a semiconductor laser 222 is adjusted at a high speed in an APC operation, an image with high quality can be displayed at a high speed.

As described above, according to a semiconductor laser drive device of the present invention, optical output characteristics with a high speed and high accuracy can be obtained in an analog manner. Therefore, a high quality image can be regenerated for display with a high speed in an image recording device of the present invention.

What is claimed is:

1. A semiconductor laser drive device comprising:
    a drive current source supplying a drive current, which is the drive current having a magnitude corresponding to a first set value, and whose gain is adjusted according to a gain control value to a semiconductor laser;
    a bias current source supplying a bias current corresponding to a current control value to said semiconductor laser;
    a monitor value generating circuit generating a monitor value which is obtained by adding a first monitor value, which is the first monitor corresponding to a second set value, and whose gain is adjusted according to said gain control value, to a second monitor value corresponding to said current control value;
    a first feedback circuit supplying a current to said bias current source and to said monitor value generating circuit, wherein a light emission quantity monitor signal, which is obtained by monitoring a light emission quantity of said semiconductor, and a predetermined first reference value are input and said current control value is generated so as to emit a light emission quantity corresponding to the first reference value from the semiconductor laser; and
    a second feedback circuit supplying a current to said drive current source and to said monitor generating circuit, wherein a monitor value which is generated in said monitor generating circuit and a predetermined second reference value are input and the gain control value is generated so as to generate the monitor value corresponding to said second reference value.

2. A semiconductor laser drive device according to claim 1, wherein a first mode supplying a current to said drive current source and monitor generating circuit, wherein the same set value as the second set value input to said drive current source as the first set value, is input to said drive current source at the same time a reference value corresponding to said second set value to said first feedback circuit is input to said first feedback circuit as said first reference value, and said gain control value is generated in said first feedback circuit in stead of said second feedback circuit;
    a second mode supplying a current to said bias current source and to said monitor generating circuit, wherein a set value different from the second set value input to said monitor generating circuit is input to said drive current source as said first set value at the same time a reference value corresponding to said first set value is input to said first feedback circuit as said first reference value, and said current control value is generated in said first feedback circuit; and
    a monitor value holding circuit holding a monitor value generated by said monitor generating circuit in said first mode, wherein the monitor value in said first mode being held in said monitor value holding circuit is input to said second feedback circuit in said second mode to generate said gain control value, and it is supplied to said drive source and to said monitor value generating circuit.

3. A semiconductor laser drive device according to claim 1, wherein said monitor generating circuit is preferably a circuit in which, when a monitor value is indicated at M, a current value of the drive current is indicated at $I_D$, a current value of said bias current is indicated at $I_B$ and a proportional constant is indicated at C, a monitor value M is generated in accordance to an equation:

$$M = C \times \{(\text{a second set value}/\text{a first set value}) \times I_D + I_B\}.$$

4. A semiconductor laser drive device according to claim 3, wherein when a light emission quantity of said semiconductor laser supplied with a current $(I_D + I_B)$ is indicated at $P_1$ and a light emission quantity of said semiconductor laser supplied with a current $\{(\text{a second set value}/\text{a first set value}) \times I_D + I_B\}$ is indicated at $P_2$, the first and second reference values may be determined, in the first and second feedback circuits, so as to generate a gain control value and a current control value which satisfy an equation:

$$P_2/P_1 = \text{a second set value}/\text{a first set value}.$$

5. A semiconductor laser drive device according to claim 3, wherein said monitor generating circuit may comprise:
    a drive current mirror circuit generating a first monitor current whose magnitude is $C \times \{(\text{a second set value}/\text{a first set value}) \times I_D\}$; and
    a bias current mirror circuit generating a second monitor current whose magnitude is $(C \times I_B)$.

6. An image recording device according to the present invention achieving an above-mentioned object is an image recording device whose function includes a step to scan a predetermined body to be scanned with a laser beam carrying image information in the course of recording an image, comprising:
    a semiconductor laser emitting a laser beam;
    a photosensor generating a light emission quantity monitor signal by monitoring a light emission quantity of said semiconductor laser;
    a semiconductor laser drive unit supplying a current to said semiconductor laser;
    a scanning optical system scanning a predetermined body to be scanned by a laser beam emitted from said semiconductor laser, and
    said semiconductor laser drive unit comprising:
        a drive current source supplying a drive current, which is the drive current having a magnitude corresponding to a first set value, and whose gain is adjusted according to a gain control value to a semiconductor laser;
        a bias current source supplying a bias current corresponding to a current control value to said semiconductor laser;
        a monitor value generating circuit generating a monitor value which is obtained by adding a first monitor value, which is the first monitor corresponding to a second set value, and whose gain is adjusted according to said gain control value, to a second monitor value corresponding to said current control value;

a first feedback circuit supplying a current to said bias current source and to said monitor value generating circuit, wherein alight emission quantity monitor signal, which is obtained by monitoring a light emission quantity of said semiconductor, and a first reference value are input and said current control value is generated so as to emit a light emission quantity corresponding to said first reference value from said semiconductor laser; and a second feedback circuit supplying a current to said drive current source and to said monitor generating circuit, wherein a monitor value which is generated in said monitor generating circuit and a second reference value are input and said gain control value is generated so as to generate said monitor value corresponding to said second reference value.

* * * * *